(12) United States Patent
Eom et al.

(10) Patent No.: US 12,532,613 B2
(45) Date of Patent: Jan. 20, 2026

(54) DISPLAY DEVICE

(71) Applicant: Samsung Display Co., LTD., Yongin-si (KR)

(72) Inventors: Tae Jong Eom, Cheonan-si (KR); Han Soo Kim, Asan-si (KR); Kyung Min Park, Cheonan-si (KR); Seung Jae Lee, Seoul (KR)

(73) Assignee: Samsung Display Co., Ltd., Youngin-si (KR)

( * ) Notice: Subject to any disclaimer, the term of this patent is extended or adjusted under 35 U.S.C. 154(b) by 353 days.

(21) Appl. No.: 16/797,703

(22) Filed: Feb. 21, 2020

(65) Prior Publication Data
US 2020/0274093 A1 Aug. 27, 2020

(30) Foreign Application Priority Data

Feb. 26, 2019 (KR) .................. 10-2019-0022645

(51) Int. Cl.
| H01L 51/52 | (2006.01) |
| H01L 27/32 | (2006.01) |
| H10K 50/82 | (2023.01) |
| H10K 50/842 | (2023.01) |
| H10K 59/131 | (2023.01) |

(Continued)

(52) U.S. Cl.
CPC ......... *H10K 59/131* (2023.02); *H10K 59/805* (2023.02); *H10K 59/82* (2023.02); *H10K 59/8722* (2023.02)

(58) Field of Classification Search
CPC ............. H01L 51/5246; H01L 51/0021; H01L 51/5203; H01L 27/1214–1296; B32B 2457/202; H05K 2201/10136; H10K 59/10–221; H10K 59/1275; H10K 59/131; H10K 59/179; H10K 59/805; H10K 59/80515; H10K 59/80522; H10K 59/80521; H10K 59/84; H10K 59/82; H10K 59/8722; H10K 71/60
See application file for complete search history.

(56) References Cited

U.S. PATENT DOCUMENTS

2002/0163611 A1* 11/2002 Kamijima ............ H10K 59/131
349/122
2006/0267492 A1 11/2006 Oh
(Continued)

FOREIGN PATENT DOCUMENTS

| KR | 10-2008-0105741 | 12/2008 |
| KR | 10-0922762 | 10/2009 |
| KR | 10-1633116 | 6/2016 |

*Primary Examiner* — Julio J Maldonado
*Assistant Examiner* — Stanetta D Isaac
(74) *Attorney, Agent, or Firm* — Sughrue Mion, PLLC

(57) ABSTRACT

Provided is a display device. The display device includes a first substrate; a second substrate disposed facing the first substrate; a sealing member disposed between and surrounding the first substrate and the second substrate and separates a space inside the sealing member from a space outside the sealing member; a pad electrode disposed on the first substrate in the space outside the sealing member; and a connection wiring disposed on the first substrate over the space inside the sealing member and the space outside the sealing member and electrically connected to the pad electrode, wherein the connection wiring comprises a multi-wiring structure located in the space outside the sealing member.

20 Claims, 15 Drawing Sheets

(51) Int. Cl.
 *H10K 59/80* (2023.01)
 *H10K 59/82* (2023.01)

(56) References Cited

U.S. PATENT DOCUMENTS

| | | | | |
|---|---|---|---|---|
| 2008/0297450 | A1* | 12/2008 | Park | H01L 27/3276 |
| | | | | 345/76 |
| 2018/0061925 | A1* | 3/2018 | Miyanaga | G02F 1/1343 |
| 2019/0036073 | A1* | 1/2019 | Yu | H01L 27/124 |
| 2019/0294281 | A1* | 9/2019 | Kim | G06F 3/0412 |

\* cited by examiner

DISPLAY DEVICE

CROSS-REFERENCE TO RELATED APPLICATION

This application claims priority to and benefits of Korean Patent Application No. 10-2019-0022645 under 35 U.S.C. § 119 filed in the Korean Intellectual Property Office on Feb. 26, 2019, the entire contents of which are incorporated herein by reference.

BACKGROUND

1. Technical Field

The disclosure provides a display device capable of lowering the probability of signal transmission failure.

Aspects of the disclosure are not restricted to the one set forth herein. The above and other aspects of the disclosure will become more apparent to one of ordinary skill in the art to which the disclosure pertains by referencing the detailed description of the disclosure given below.

2. Description of the Related Art

With the continuing and evolving development of multimedia, display devices are becoming increasingly important and in demand. Accordingly, various types of display devices such as liquid crystal displays (LCDs) and organic light emitting displays (OLEDs) are being used. Of these display devices, OLEDs which are self-light emitting devices are drawing attention as next-generation display devices due to their excellent viewing angle, light weight, thinness, and flexibility.

An OLED may include two substrates facing each other. The two substrates may be bonded together by, for example, frit. A pad unit may be provided outside the frit. An external driving circuit board is attached to the pad unit and transmits signals to an internal space surrounded by the frit. An insulating layer may be damaged in the process of forming the frit, attaching the driving circuit board, or cutting a substrate. Accordingly, a signal transmission wiring may be damaged, thereby causing signal transmission failure.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment of a display device may include a first substrate; a second substrate disposed facing the first substrate; a sealing member disposed between and surrounding the first substrate and the second substrate and separates a space inside the sealing member from a space outside the sealing member; a pad electrode disposed on the first substrate in the space outside the sealing member; and a connection wiring disposed on the first substrate over the space inside the sealing member and the space outside the sealing member and electrically connected to the pad electrode, wherein the connection wiring may comprise a multi-wiring structure disposed in the space outside the sealing member.

The multi-wiring structure may include a parallel wiring in plan view, and the parallel wiring may include a stem wiring and one or more branch wirings connected to the stem wiring in the space outside the sealing member.

The stem wiring and the branch wirings may be located on a same layer.

The branch wirings may extend in a same direction as the stem wiring.

The display device may include an inorganic insulating layer which may be disposed on the first substrate and an organic insulating layer which may be disposed on the inorganic insulating layer, wherein, in the space outside the sealing member, the inorganic insulating layer covers the parallel wiring, and the organic insulating layer at least partially exposes the parallel wiring.

An outer connection point at which the stem wiring and the branch wirings may be connected in the space outside the sealing member overlaps the organic insulating layer.

The organic insulating layer may be spaced apart from the sealing member.

The stem wiring and the branch wirings may be further connected at an inner connection point in the space inside the sealing member.

The organic insulating layer disposed in the space inside the sealing member may be spaced apart from the sealing member, and the inner connection point may be located in an area in which the organic insulating layer and the sealing member are spaced apart from each other.

The display device may further comprise a first conductive layer disposed on the first substrate; an inorganic insulating layer disposed on the first conductive layer; and a second conductive layer disposed on the inorganic insulating layer.

The multi-wiring structure may comprise the first conductive layer and the second conductive layer which overlaps the first conductive layer and is electrically connected to the first conductive layer through at least one contact hole.

An embodiment of a display device may include a base substrate; a first gate conductive layer disposed on the base substrate; a first insulating layer disposed on the first gate conductive layer; a second gate conductive layer disposed on the first insulating layer; a third insulating layer disposed on the second gate conductive layer; a data conductive layer disposed on the third insulating layer; a fourth insulating layer disposed on the data conductive layer; an anode disposed on the fourth insulating layer; a light emitting layer disposed on the anode; a cathode disposed on the light emitting layer; an encapsulation substrate disposed on the cathode; and a sealing member interposed between the base substrate and the encapsulation substrate, wherein the base substrate may comprise a pad area protruding outward from the sealing member. The pad area may comprise a fourth insulating layer open section in which the fourth insulating layer may not be disposed and a fourth insulating layer cover section in which the fourth insulating layer may be disposed, wherein the fourth insulating layer open section and the fourth insulating layer cover section may be sequentially arranged in a direction outward from the sealing member, and a pad electrode and a connection wiring which may be electrically connected to the pad electrode. The connection wiring may comprise the first gate conductive layer or the second gate conductive layer disposed in the pad area, and the connection wiring may comprise a parallel wiring which may include a stem wiring disposed in the fourth insulating layer open section and one or more branch wirings electrically connected to the stem wiring.

The stem wiring and the branch wirings may be electrically connected in the fourth insulating layer cover section.

The stem wiring and the branch wirings may be located on a same layer.

The branch wirings may extend in a same direction as the stem wiring.

The pad electrode may comprise the data conductive layer.

The pad electrode may be electrically connected to the connection wiring through a contact hole in the fourth insulating layer cover section.

The connection wiring may comprise the second gate conductive layer, the third insulating layer comprises a crack in the fourth insulating layer open section.

The crack in the third insulating layer may expose a portion of the parallel wiring to an external environment.

Some of the stem wiring and the branch wirings of the parallel wiring may be corroded, and the other wirings may not be corroded.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
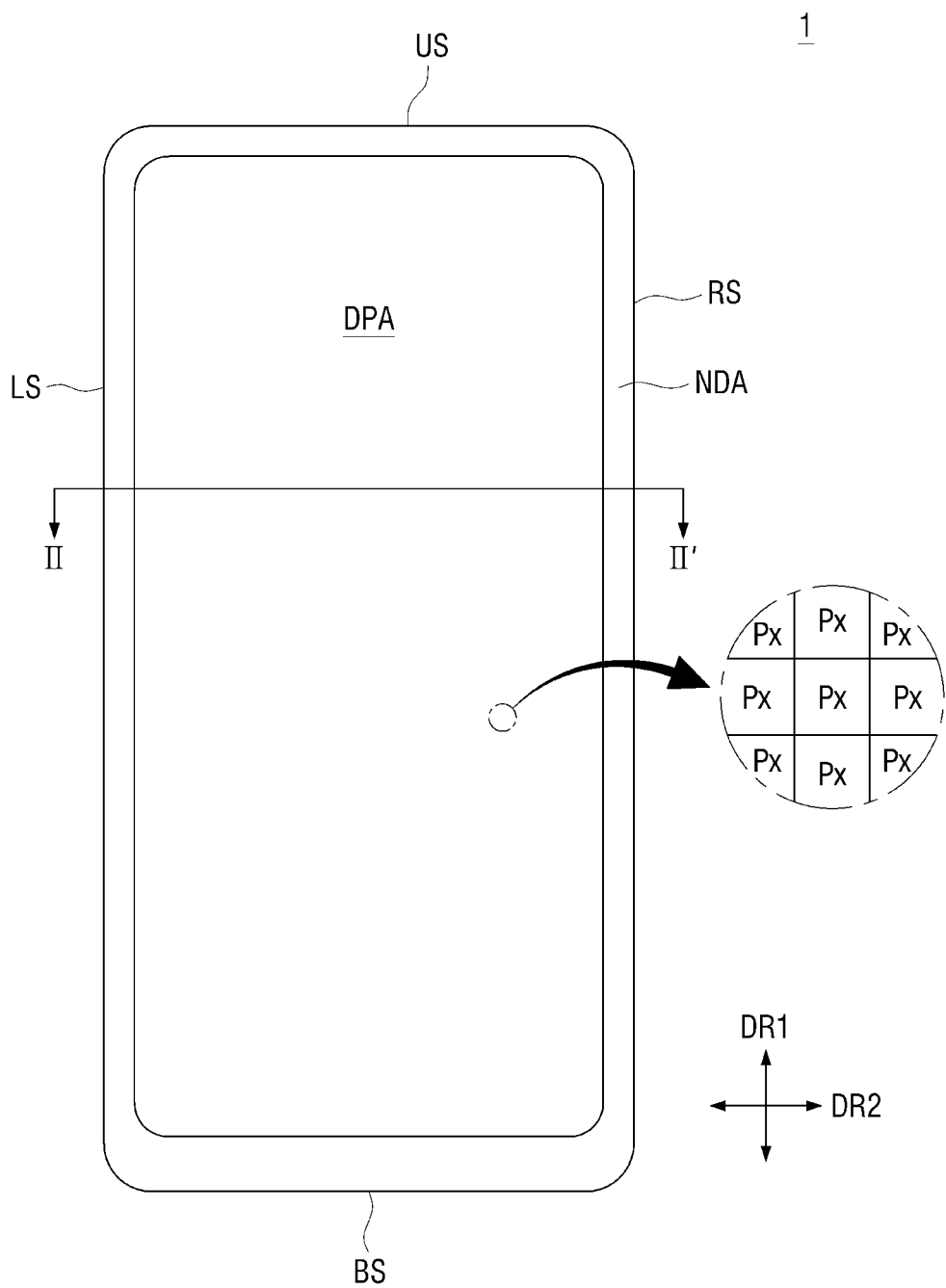
FIG. 1 is a plan view of a display device according to an embodiment.

Embodiments of the invention will now be described hereinafter with reference to the accompanying drawings.

Although the invention may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

The disclosed embodiments of the invention are used in a generic and descriptive sense only and not for purposes of limitation.

Like reference numerals refer to like elements throughout the specification. When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

FIG. 1 is a plan view of a display device 1 according to an embodiment.

Referring to FIG. 1, the display device 1 may refer to any electronic device that provides a display. Examples of the display device 1 may include portable electronic devices that provide a display screen, such as a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine and a digital camera, as well as a television, a notebook, a monitor, a billboard and the Internet of things as well as other devices.

The display device 1 includes a display area DPA and a non-display area NDA. The display area DPA may be defined as an area where a screen is displayed, and the non-display area NDA may be defined as an area where a screen is not displayed. The display area DPA may be shaped like a rectangle or a rectangle with rounded corners. The display area DPA shown in the drawing may be shaped like a rectangle that has rounded corners and is longer in a first direction DR1 than in a second direction DR2 in plan view (that is, a rectangle whose upper side US and lower side BS are short sides and left side LS and right side RS are long sides). However, embodiments are not limited thereto, and the display area DPA may have various shapes such as a rectangle that is longer in the second direction DR2 than in the first direction DR1, a square or other polygons, a circle, and an ellipse and other suitable shapes and areas.

The display device 1 may include pixels PX disposed in the display area DPA. The pixels PX may be arranged in a matrix direction, for example. Each of the pixels PX may be rectangular or square in plan view. However, the planar shape of each of the pixels PX is not limited to the above examples and may also be a rhombic shape having each side inclined with respect to the first direction DR1. The pixels PX may include color pixels. For example, the pixels PX may include red pixels, green pixels, and blue pixels. The color pixels PX may be arranged in a stripe pattern or a pentile pattern, for example, clusters of pixels or subpixels. In some embodiments, the pixels PX may include white pixels or light-transmitting pixels by way of further example.

The display area DPA generally occupies a central portion of the display device 1, and the non-display area NDA may be disposed around or in proximity to the display area DPA. The non-display area NDA may be a bezel area. In the non-display area NDA, signal wirings or driving circuits for transmitting signals to the display area DPA may be disposed.

The non-display area NDA may surround all sides (four sides in the drawing) of the display area DPA. In an embodiment, the width of the non-display area NDA located on the upper side US and the lower side BS of the display device 1 may be greater than that of the non-display area NDA located on the left side LS and the right side RS of the display device 1. The width of the non-display area NDA located on the upper side US of the display device 1 may be smaller than that of the non-display area NDA located on the lower side BS of the display device 1. However, embodiments are not limited thereto. For example, the non-display area NDA may not be disposed around the upper side US or around the left side LS and the right side RS of the display area DPA. The non-display area NDA may be defined by an outermost black matrix or a print layer 32 (as illustrated in FIG. 2) of a window member 30 to be described later, but embodiments are not limited thereto.

Figure 2:
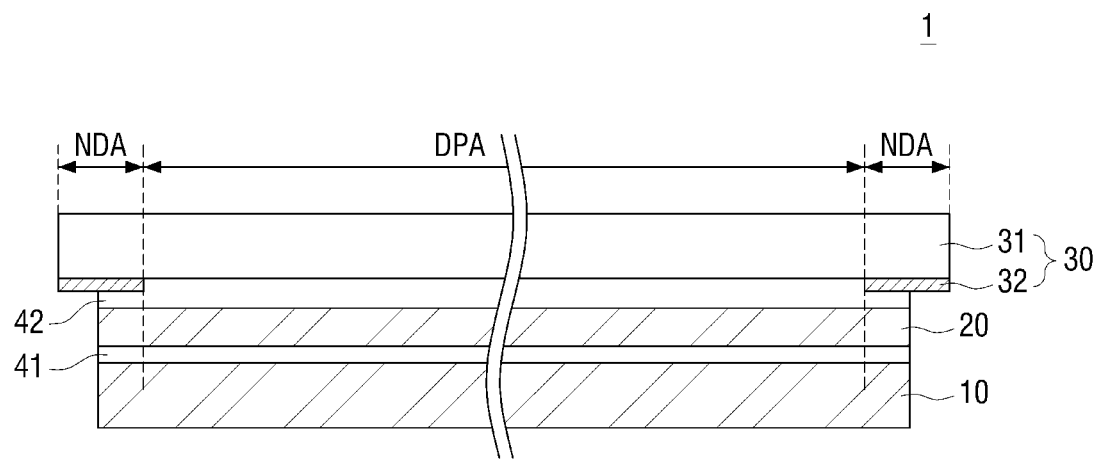
FIG. 2 is a schematic cross-sectional view taken along line II-II' of FIG. 1.

FIG. 2 is a schematic cross-sectional view taken along line II-IF of FIG. 1.

Referring to FIG. 2, the display device 1 includes a display panel 10 that provides a display screen. Examples of the display panel 10 may include an organic light emitting display panel, a micro light emitting diode (LED) display panel, a nano LED display panel, a quantum dot light emitting display panel, a liquid crystal display panel, a plasma display panel, a field emission display panel, an electrophoretic display panel, and an electrowetting display panel. An embodiment of an organic light emitting display panel is applied as an example of the display panel 10 will be described below, but embodiments are not limited thereto and other embodiments are possible within the spirit and scope of the invention.

The display device 1 may further include a touch member 20 and the window member 30. For example, the touch member 20 may be disposed on the display panel 10, and the window member 30 may be disposed on the touch member 20. Here, 'on the display panel 10' may indicate a direction in which a display surface of the display panel 10 faces.

The touch member 20 may be a touch sensor. The touch member 20 senses an input. The touch member 20 may be provided as a separate panel or film from the display panel 10. As a further example, the touch member 20 may also be provided in the form of a touch layer in the display panel 10. The touch member 20 may include touch electrodes. The touch electrodes may include driving electrodes and sensing electrodes. The driving electrodes for recognizing coordinates of an input may be arranged in a matrix, but embodiments are not limited thereto.

The window member 30 protects the touch member 20 and the display panel 10. The window member 30 may be larger than the touch member 20 and the display panel 10, and its surfaces, to include side surfaces, may protrude further than the touch member 20 and the display panel 10 in plan view. For example, side surfaces may protrude further than the touch member 20 and the display panel 10 in plan view.

The window member 30 may include a window base 31 and the print layer 32 disposed on edges or surfaces of the window base 31. The window base 31 may be made of a transparent material. The window base 31 may include, for example, tempered glass or transparent plastic or any other suitable materials.

The print layer 32 may be disposed on at least one surface of the window base 31. The print layer 32 may be disposed along the edges or surfaces of the window base 31 and may define the non-display area NDA. The print layer 32 may be a black ink layer, but may also be a decorative layer of various colors for aesthetic purposes.

The display panel 10, the touch member 20, and the window member 30 may be bonded to each other by transparent bonding layers 41 and 42 such as optically clear adhesive films, optically clear adhesive tapes, or optically clear resins or similar materials. That is, the touch member 20 may be attached onto the display panel 10 by a first transparent bonding layer 41, and the window member 30 may be attached onto the touch member 20 by a second transparent bonding layer 42. When the touch member 20 is provided as a layer inside the display panel 10, the window member 30 may be directly attached onto the display panel 10 by a transparent bonding layer. Although not illustrated in the drawing, an optical film such as a polarizing film may be further disposed between the touch member 20 and the window member 30.

Figure 3:
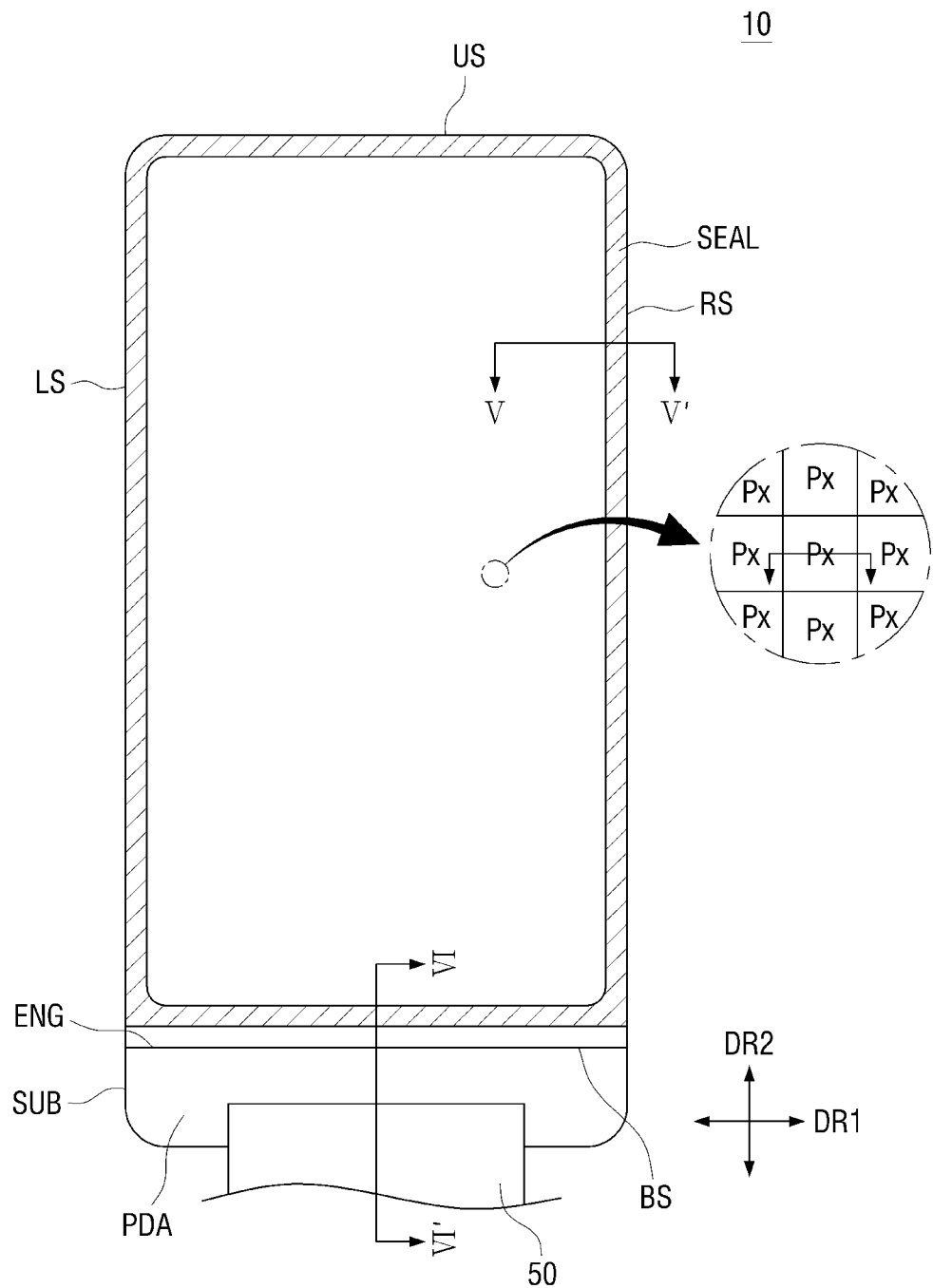
FIG. 3 is a schematic plan view of a display panel according to an embodiment.

FIG. 3 is a schematic plan view of a display panel 10 according to an embodiment.

Referring to FIG. 3, the display panel 10 includes two substrates disposed to face each other. One of the two substrates may be a base substrate SUB, and the other substrate may be an encapsulation substrate ENG as a counter substrate.

The base substrate SUB and the encapsulation substrate ENG may overlap in a thickness direction, and at least one side of the base substrate SUB may protrude. For example, the lower side BS which is an end of the base substrate SUB in the first direction DR1 in FIG. 2 may protrude further than the lower side BS of the encapsulation substrate ENG. A section extending from an area overlapping the lower side BS of the encapsulation substrate ENG to the lower side BS of the base substrate SUB may be an exposed area not covered by the encapsulation substrate ENG. The lower side BS of the base substrate SUB also protrudes from a sealing member SEAL, and a pad area PDA including pad electrodes may be provided in the protruding portion. Since this area is exposed by the encapsulation substrate ENG, a space to which a printed circuit board 50 may be attached may be provided. The upper side US, the left side LS and the right side RS of the base substrate SUB may be aligned with the upper side US, left side LS and right side RS of the encapsulation substrate ENG.

The base substrate SUB and the encapsulation substrate ENG may be bonded to each other by the sealing member SEAL. The sealing member SEAL may be a sealant. The sealing member SEAL may include frit or bonding resin or other suitable materials. The sealing member SEAL may be disposed along edges of the encapsulation substrate ENG. The sealing member SEAL may be shaped like a frame having a predetermined width in plan view, for example, a quadrilateral frame in the drawing.

An outer surface of the sealing member SEAL may be generally aligned with an outer side (or an outer surface) of the encapsulation substrate ENG. However, on the lower side BS of the encapsulation substrate ENG, the sealing member SEAL may be disposed further in than a side surface of the lower side BS of the encapsulation substrate ENG instead of being aligned with the side surface of the lower side BS of the encapsulation substrate ENG. That is, the lower side BS of the encapsulation substrate ENG may protrude further outward than the adjacent sealing member SEAL.

The sealing member SEAL separates a space inside the sealing member SEAL from a space outside the sealing member SEAL. The sealing member SEAL may define a space inside of the sealing member SEAL and a space outside of the sealing member SEAL. The space inside the sealing member SEAL may be sealed by the base substrate SUB, the encapsulation substrate ENG and the sealing member SEAL. The space outside the sealing member SEAL may be exposed to an external environment. Light emitting elements may be disposed in the sealed space inside the sealing member SEAL.

Figure 4:
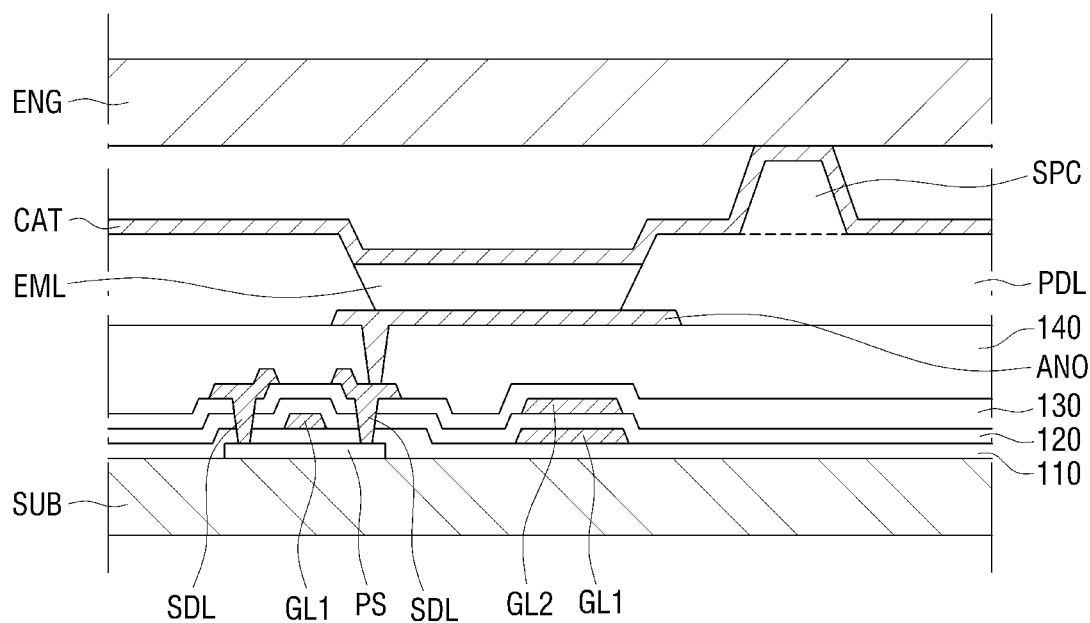
FIG. 4 is a cross-sectional view of one pixel of the display panel.

FIG. 4 is a cross-sectional view of one pixel PX of the display panel 10.

Referring to FIGS. 3 and 4, the pixel PX of the display panel 10 may include the base substrate SUB, a pixel driving circuit structure disposed on the base substrate SUB, a light emitting element disposed on the pixel driving circuit structure, and the encapsulation substrate ENG disposed on the light emitting element. The pixel driving circuit structure may include a thin-film transistor. The light emitting element may include a first electrode (an anode ANO), a second electrode (a cathode CAT), and a light emitting layer EML disposed between the first electrode and the second electrode. The display panel 10 may further include a bank layer PDL that may define the pixel PX. The cross-sectional structure of the pixel PX of the display panel 10 will now be described in detail.

The base substrate SUB may support each layer disposed on the base substrate SUB. For example, the base substrate SUB may support the pixel driving circuit structure, the light emitting element disposed on the pixel driving circuit structure, a thin-film transistor, the first electrode (an anode ANO), the second electrode (a cathode CAT), and the light emitting layer EML disposed between the first electrode and the second electrode, and the bank layer PDL. The base substrate SUB may include a rigid material such as glass or quartz. In some embodiments, the base substrate SUB may include flexible plastic such as polyimide. The material of the base substrate SUB may be of any suitable material and selected to meet the type of the display.

A semiconductor layer PS may be disposed on the base substrate SUB. The semiconductor layer PS may form a channel of the thin-film transistor. The semiconductor layer PS may include polycrystalline silicon. In an embodiment, the semiconductor layer PS may include monocrystalline silicon, low-temperature polycrystalline silicon, amorphous silicon, or an oxide semiconductor. Examples of the oxide semiconductor may include a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), or other similar materials. In an embodiment, the semiconductor layer PS may include ITZO (an oxide including indium, tin and titanium) or IGZO (an oxide including indium, gallium and tin) or other similar materials.

Although not shown, a buffer layer or a barrier layer including an inorganic material such as silicon oxide, silicon nitride or silicon oxynitride may be further disposed between the base substrate SUB and the semiconductor layer PS. The buffer layer or the barrier layer may be disposed over the entire surface of the base substrate SUB. A lower metal film (not shown) may be further disposed between the base substrate SUB and the semiconductor layer PS to prevent light from propagating to the semiconductor layer PS. The lower metal film may be electrically connected to a conductive layer (for example, a first gate conductive layer GL1) disposed above the lower metal film, but embodiments are not limited thereto.

A first insulating layer 110 may be disposed on the semiconductor layer PS. The first insulating layer 110 may be a first gate insulating film or layer functioning as gate insulation. The first insulating layer 110 may include a silicon compound, a metal oxide, or the like. For example, the first insulating layer 110 may include silicon oxide, silicon nitride, silicon oxynitride, aluminum oxide, tantalum oxide, hafnium oxide, zirconium oxide, titanium oxide, or other suitable materials. These materials may be used alone or in combination with each other. The first insulating layer 110 may be a single layer or a multilayer consisting of stacked layers of different materials.

The first gate conductive layer GL1 may be disposed on the first insulating layer 110. The first gate conductive layer GL1 may include a gate electrode of the thin-film transistor, a scan line connected to the gate electrode, and a first electrode of a storage capacitor.

The first gate conductive layer GL1 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first gate conductive layer GL1 may be a single layer or a multilayer structure.

A second insulating layer 120 may be disposed on the first gate conductive layer GL1. The second insulating layer 120 may be a second gate insulating film or layer or an interlayer insulating film. The second insulating layer 120 may include an inorganic insulating material such as silicon oxide, silicon nitride, silicon oxynitride, hafnium oxide, aluminum oxide, titanium oxide, tantalum oxide or zinc oxide. The second insulating layer 120 may be a single layer or a multilayer structure.

A second gate conductive layer GL2 may be disposed on the second insulating layer 120. The second gate conductive layer GL2 may include a second electrode of the storage capacitor. Similar to the first gate conductive layer GL1, the second gate conductive layer GL2 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second gate conductive layer GL2 may be made of the same material or similar material as the first gate conductive layer GL1, but embodiments are not limited thereto. The second gate conductive layer GL2 may be a single layer or a multilayer structure.

A third insulating layer 130 may be disposed on the second gate conductive layer GL2. The third insulating layer 130 may be an interlayer insulating film or layer. The third insulating layer 130 may include an inorganic insulating material such as silicon oxide, silicon nitride, silicon oxynitride, hafnium oxide, aluminum oxide, titanium oxide, tantalum oxide or zinc oxide. The third insulating layer 130 may be a single layer or a multilayer structure consisting of stacked layers of different materials. The third insulating layer 130 may be an inorganic film. In some embodiments, however, the third insulating layer 130 may further include an organic insulating material.

A data conductive layer SDL may be disposed on the third insulating layer 130. The data conductive layer SDL may include a first electrode (for example, a source electrode) and a second electrode (for example, a drain electrode) of the thin-film transistor and a first power supply wiring. The first electrode and the second electrode of the thin-film transistor may be electrically connected to a source region and a drain region of the semiconductor layer PS through contact holes penetrating the third insulating layer 130, the second insulating layer 120 and the first insulating layer 110.

The first power supply wiring of the data conductive layer SDL may supply a first power to the first electrode (for example, the anode ANO) of the light emitting element. The first power supply wiring may be electrically connected to the second electrode of the storage capacitor through a contact hole penetrating the third insulating layer 130.

The data conductive layer SDL may further include a second power supply wiring which supplies a second power to the second electrode (the cathode CAT) of the light emitting element. The second power supply wiring may also be made of the first gate conductive layer GL1 or the second conductive layer GL2 other than the data conductive layer SDL. In some embodiments, the second power supply wiring may be made of a different conductive layer depending on an area where the second power supply wiring may be disposed. For example, a portion of the second power supply wiring may be made of the data conductive layer SDL, and the other portion may be made of the second gate conductive layer GL2.

The data conductive layer SDL may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The data conductive layer SDL may be a single layer or a multilayer structure. For example, the data conductive layer SDL may have a stacked structure of Ti/Al/Ti, Mo/Al/Mo, Mo/AlGe/Mo, or Ti/Cu.

A fourth insulating layer 140 may be disposed on the data conductive layer SDL. The fourth insulating layer 140 may cover the data conductive layer SDL. The fourth insulating layer 140 may be a via layer or an organic insulating film. The fourth insulating layer 140 may include an organic insulating material such as, for example, polyacrylates resin, epoxy resin, phenolic resin, polyamides resin, polyimides resin, unsaturated polyesters resin, polyphenylenethers resin, polyphenylenesulfides resin or benzocyclobutene (BCB).

The anode ANO may be disposed on the fourth insulating layer 140. The anode ANO may be a pixel electrode disposed in each pixel PX. The anode ANO may be connected to the second electrode of the thin-film transistor through a contact hole penetrating the fourth insulating layer 140.

The anode ANO may have, but is not limited to, a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture of the same are stacked. The material layer having a high work function may be disposed on the reflective material layer to be close to an organic layer. The anode ANO may have a multilayer structure of, but not limited to, ITO/Mg, ITO/MgF, ITO/Ag, or ITO/Ag/ITO.

The bank layer PDL may be disposed on the anode ANO. The bank layer PDL may include an opening exposing the anode ANO. The bank layer PDL may surround each anode ANO. The bank layer PDL may have a lattice shape or a mesh shape in which two different lines intersect each other in plan view. The bank layer PDL may include other shapes and arrangements commensurate with the spirit and scope of the invention.

The bank layer PDL may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCE). The bank layer PDL may also include an inorganic material.

A spacer SPC may be disposed on the bank layer PDL. The spacer SPC may be disposed directly on the bank layer PDL. The spacer SPC may overlap the bank layer PDL in the thickness direction.

The spacer SPC may maintain a gap between a structure disposed on the spacer SPC and a structure disposed under the spacer SPC. For example, the spacer SPC may prevent sagging of the encapsulation substrate ENG and maintain a gap between the bank layer PDL and the encapsulation substrate ENG. Further, the spacer SPC may prevent a fine metal mask (FMM) from sagging when an organic layer is deposited through the FMM.

The spacer SPC may, as an example, have a narrower width than the bank layer PDL. The spacer SPC may be disposed only on a portion of the bank layer PDL. For example, the spacer SPC may be disposed at an intersection of lines of the bank layer PDL. The spacer SPC may be disposed not at all intersections of the lines of the bank layer PDL but at some of the intersections. For example, the spacer SPC may be disposed at an intersection of the lines of the bank layer PDL at intervals of four pixels PX along a first direction DR1 and the second direction DR2.

The spacer SPC may include an organic insulating material, like the bank layer PDL. The spacer SPC may be made of a separate layer from the bank layer PDL, but may also be made of the same material as the bank layer PDL through a single process. For example, the bank layer PDL and the spacer SPC may be formed to have different heights in a single process by applying a photosensitive organic material and exposing and developing the photosensitive organic material using a slit mask or a halftone mask, or other suitable mask.

The light emitting layer EML may be disposed on the anode ANO exposed by the bank layer PDL. The light emitting layer EML may include an organic layer. The organic layer may include an organic light emitting layer and may further include a hole injection/transport layer and/or an electron injection/transport layer.

The cathode CAT may be disposed on the organic layer of the light emitting element EML. The cathode CAT may be a common electrode disposed between the pixels PX. The anode ANO, the organic layer, and the cathode CAT may form an organic light emitting element.

The cathode CAT may contact not only the light emitting layer EML but also an upper surface of the bank layer PDL. In an area where the spacer SPC is formed, the cathode CAT may contact a surface of the spacer SPC and cover the surface of the spacer SPC.

The cathode CAT may include a material layer having a small work function, such as Li, Ca, LiF/Ca, LiF/Al, Al, Mg, Ag, Pt, Pd, Ni, Au, Nd, Ir, Cr, BaF, Ba, or a compound or mixture of the same (for example, a mixture of Ag and Mg). The cathode CAT may further include a transparent metal oxide layer disposed on the material layer having a small work function.

The encapsulation substrate ENG may be disposed above the cathode CAT. The encapsulation substrate ENG may cover the light emitting element from above to prevent the light emitting element from being exposed to moisture, oxygen, or other potentially damaging elements. The encapsulation substrate ENG may be bonded to the base substrate SUB by the sealing member SEAL as described above. In an embodiment in which the display panel 10 is of a top emission type, the encapsulation substrate ENG may include transparent glass or plastic. When the display panel 10 is of a bottom emission type, the encapsulation substrate ENG may include an opaque material.

Figure 5:
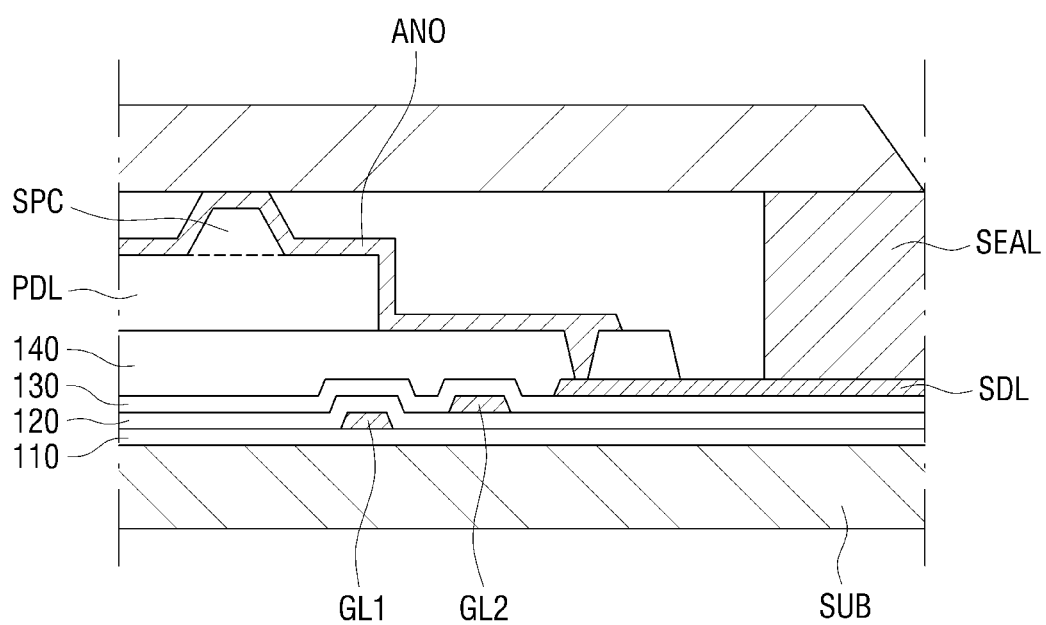
FIG. 5 is a cross-sectional view taken along line V-V' of FIG. 3.
Figure 6:
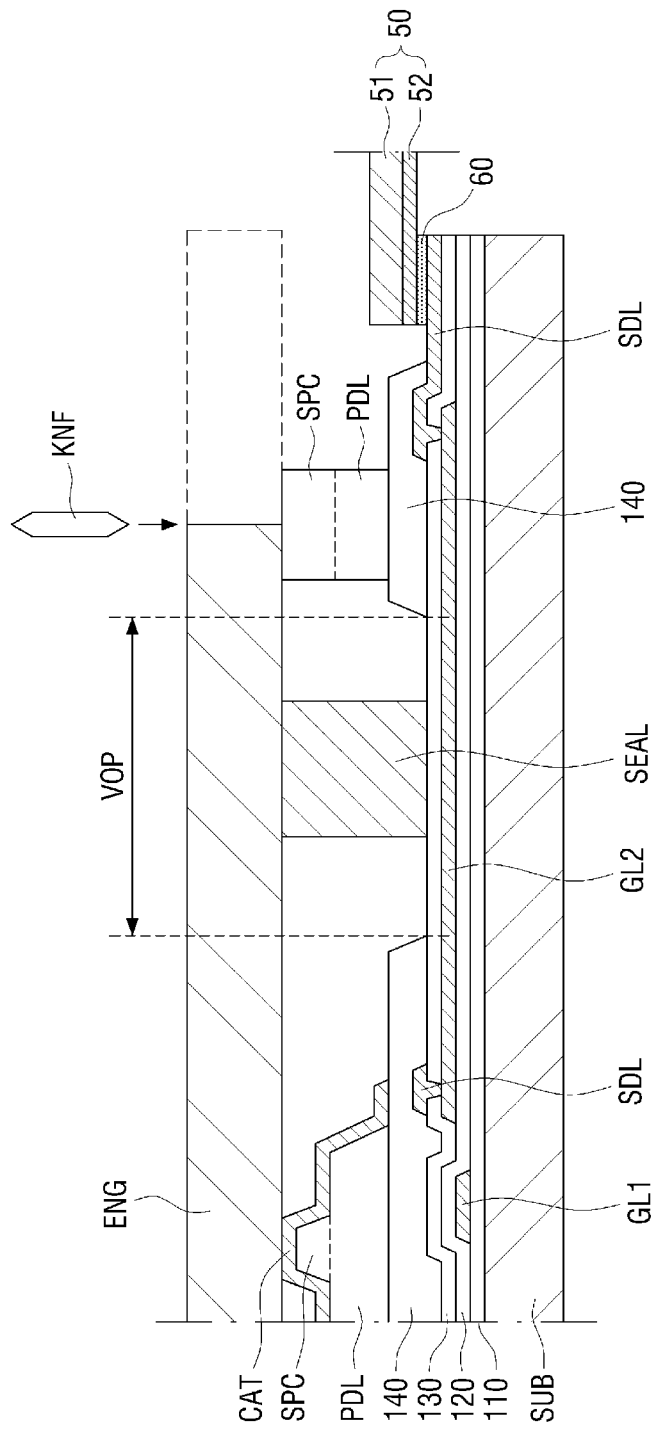
FIG. 6 is a cross-sectional view taken along line VI-VI' of FIG. 3.

FIGS. 5 and 6 show cross sections of the non-display area NDA of an edge portion of the display panel 10.

FIG. 5 is a cross-sectional view taken along line V-V' of FIG. 3.

Referring to FIGS. 3 and 5, the right side RS which may be a long side of the display panel 10 may be generally aligned with a side surface of the base substrate SUB, a side surface of the sealing member SEAL, and a side surface of the encapsulation substrate ENG. The side surface of the encapsulation substrate ENG may be inclined at an acute angle, but embodiments are not limited thereto.

The fourth insulating layer 140 which may be a via layer may be disposed over the whole of the display area DPA, but may not be disposed in the edge portion on the right side RS of the display panel 10. The fourth insulating layer 140 may not overlap the sealing member SEAL and may be spaced apart from the sealing member SEAL by a predetermined distance. Accordingly, the fourth insulating layer 140 may not be exposed to the outside of the right side RS of the display panel 10. Since the fourth insulating layer 140 made of an organic material may not be exposed to the outside, moisture or the other damaging elements may be prevented from reaching the pixels PX of the display area DPA through the inside of the organic material. Since the fourth insulating layer 140 may be spaced apart from the sealing member SEAL, outgassing of the organic material due to high heat generated during the formation of the sealing member SEAL may be reduced.

The data conductive layer SDL may be disposed in the edge portion on the right side RS of the display panel 10. However, the side or portion upon which the data conductive layer SDL may be disposed is not limited thereto. The data conductive layer SDL of the edge portion may be used as the second power supply wiring. The second power supply wiring may extend along edges of the display panel 10 and may be electrically connected to the cathode CAT through a contact hole penetrating the fourth insulating layer 140.

The data conductive layer SDL may overlap the sealing member SEAL and may be disposed directly on the sealing member SEAL. When the sealing member SEAL is formed by sintering frit with laser irradiation, the data conductive layer SDL overlapping the sealing member SEAL may absorb laser light, thereby helping sinter the frit.

The first gate conductive layer GL1 and the second gate conductive layer GL2 may be further disposed in the edge portion on the right side RS of the display panel 10. The above conductive layers may form a signal wiring or a circuit element such as a gate driving circuit.

Although not shown, the left side LS which is the other long side of the display panel 10 may also have substantially the same cross-sectional structure as that of FIG. 5. The upper side US which is a short side of the display panel 10 may also have a cross-sectional structure similar to that of FIG. 5.

FIG. 6 is a cross-sectional view taken along line VI-VI' of FIG. 3. Referring to FIGS. 3 and 6, the lower side BS which is the other short side of the display panel 10 may have a different cross-sectional structure from that of FIG. 5 because the base substrate SUB protrudes further than the encapsulation substrate ENG, and the pad area PDA may be provided in the protruding area as described above.

The fourth insulating layer 140 which may be a via layer may not be disposed before and after the sealing member SEAL in the edge portion on the lower side BS of the display panel 10. As described above, when the fourth insulating layer 140 made of an organic material disposed continuously from the display area DPA is exposed to the outside of the display panel 10, moisture or other damaging elements may permeate through the inside of the organic material, and outgassing may occur during the formation of the sealing member SEAL. Therefore, the fourth insulating layer 140 may be spaced apart from the sealing member SEAL.

The bank layer PDL and the spacer SPC may be disposed on the fourth insulating layer 140 located in a space outside the sealing member SEAL. The bank layer PDL and the spacer SPC may have substantially the same width in the space outside the sealing member SEAL. The bank layer PDL and the spacer SPC in the space outside the sealing member SEAL may support the encapsulation substrate ENG when the encapsulation substrate ENG is cut using, for example, a cutting wheel KNF. Since the lower side BS of the encapsulation substrate ENG may be cut on the bank layer PDL and the spacer SPC that it overlaps, a side surface on the lower side BS of the encapsulation substrate ENG may be disposed on the bank layer PDL and the spacer SPC.

A pad electrode PAD (see FIG. 7) including the data conductive layer SDL may be disposed on the base substrate SUB outside the sealing member SEAL, in other words, in the space outside the sealing member SEAL. The fourth insulating layer 140 in the space outside the sealing member SEAL may cover a portion of the pad electrode PAD, but exposes at least the other portion of the pad electrode PAD. The printed circuit board 50 may be attached onto the pad electrode PAD exposed by the fourth insulating layer 140. The printed circuit board 50 may be a flexible printed circuit board 50 including a flexible material such as polyimide. The printed circuit board 50 may include a base 51 and a bump 52 disposed on the base 51. The bump 52 may be disposed to face the pad electrode PAD. An anisotropic conductive film 60 may be interposed between the bump 52 and the pad electrode PAD. The anisotropic conductive film 60 may not only attach the bump 52 of the printed circuit board 50 onto the pad electrode PAD but also electrically connect the bump 52 and the pad electrode PAD.

The pad electrode PAD may be connected to a signal wiring located inside the sealing member SEAL, in other words, a signal wiring located in a space inside the sealing member SEAL. A signal wiring or a connection wiring SCW (SCW1, SCW2) for connecting the signal wiring and the pad electrode PAD may be disposed over the space inside the sealing member SEAL and the space outside the sealing member SEAL. The connection wiring SCW may include a conductive layer located lower than the third insulting layer 130, for example, the second conductive layer GL2. The pad electrode PAD may be made of the data conductive layer SDL. However, since the pad electrode PAD may be corroded by moisture or oxygen or otherwise compromised when exposed to the outside in a fourth insulating layer open section VOP, it may pass under the sealing member SEAL using a conductive layer disposed under the sealing member SEAL. The pad electrode PAD and the connection wiring SCW may be electrically connected through a contact hole penetrating the third insulating layer 130.

The connection wiring SCW located in the fourth insulating layer open section VOP may be more likely to be damaged than a section covered with the fourth insulating layer 140. Therefore, the connection wiring SCW may include a plurality of wirings. This will now be described in detail with reference to FIGS. 7 through 10.

Figure 7:
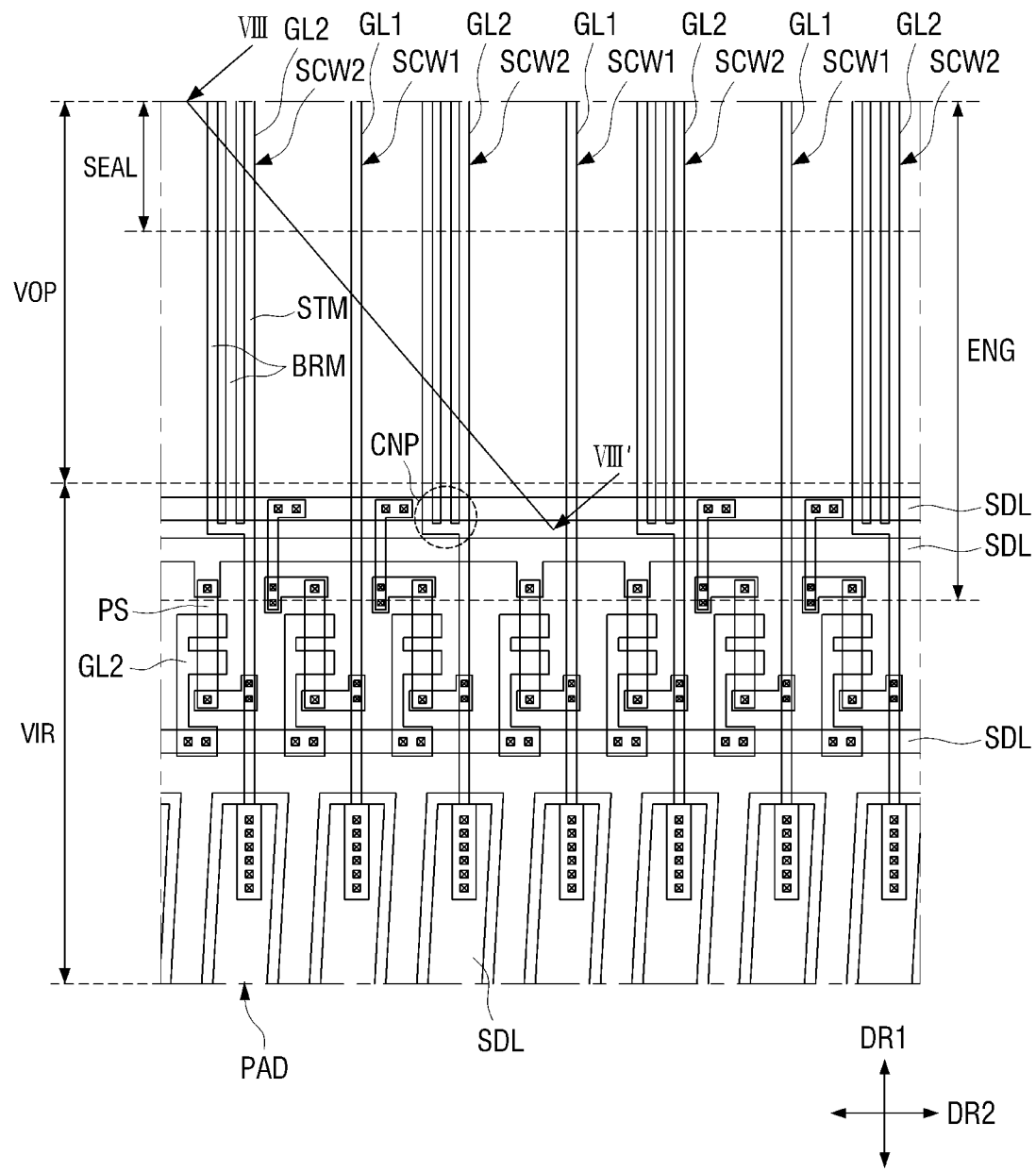
FIG. 7 is a partial plan layout view of the display panel according to the embodiment.
Figure 8:
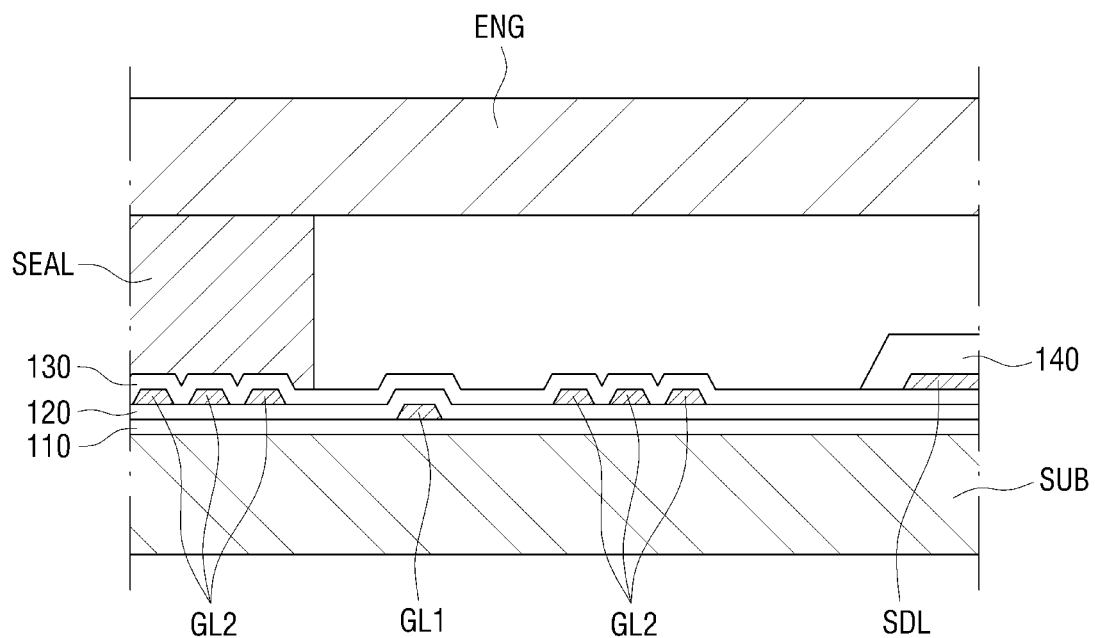
FIG. 8 is a cross-sectional view taken along line VIII-VIII' of FIG. 7.
Figure 9:
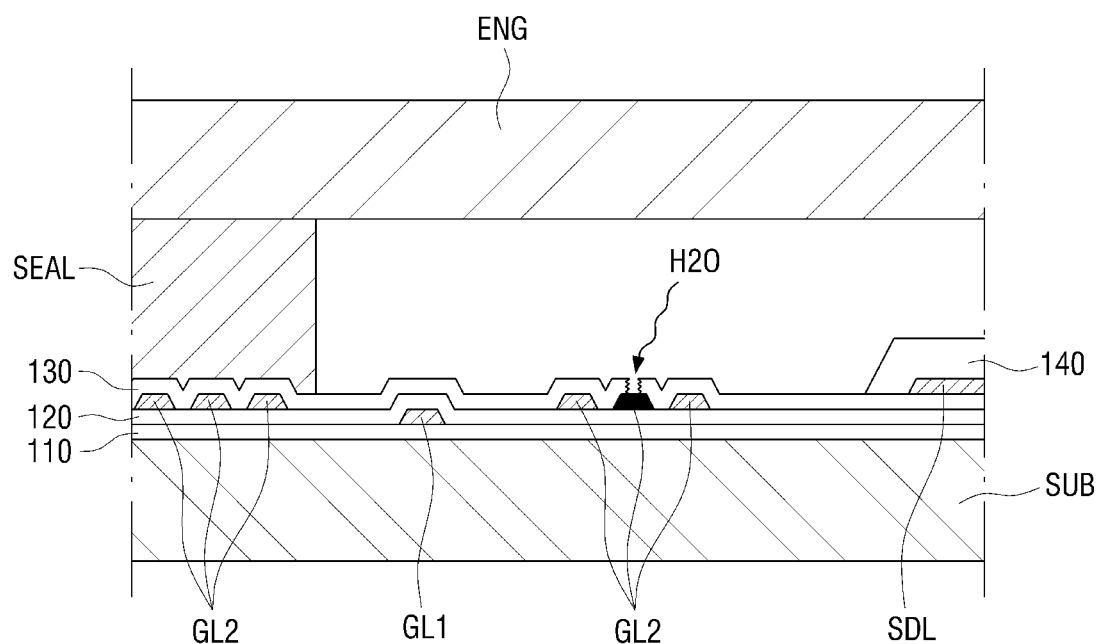
FIG. 9 is a cross-sectional view of a display panel according to embodiments.

FIG. 7 is a partial plan layout view of the display panel 10 according to the embodiment. FIG. 7 shows the planar layout of the display panel 10 from an area where the sealing member SEAL may be disposed on the lower side BS of the display panel 10 to an area where pad electrodes PAD are formed. FIG. 8 is a cross-sectional view taken along line VIII-VIII' of FIG. 7. FIG. 9 is a cross-sectional view of a display panel according to embodiments.

Referring to FIGS. 7 and 8, on the lower side BS of the display panel 10, the fourth insulating layer open section VOP in which the fourth insulating layer 140 may not be formed and a fourth insulating layer cover section VIR in which the fourth insulating layer 140 may be disposed are sequentially arranged outward (downward in FIG. 7) in the first direction DR1 in plan view. Although not shown, an area where the fourth insulating layer 140 may be partially removed to expose the pad electrodes PAD may be disposed again outside the fourth insulating layer cover section VIR in the first direction DR1.

A section in which the sealing member SEAL may be disposed may be included in the fourth insulating layer open section VOP. The encapsulation substrate ENG may cover the whole of the fourth insulating layer open section VOP and may overlap even a portion of the fourth insulating layer cover section VIR.

Connection wiring SCW may extend from the sealing member SEAL toward the fourth insulating layer open section VOP and the fourth insulating layer cover section VIR along the first direction DR1. Each of the connection wirings SCW may be made of the first gate conductive layer GL1 or the second gate conductive layer GL2. In an embodiment, a first connection wiring SCW1 including the first gate conductive layer GL1 and a second connection wiring SCW2 including the second gate conductive layer GL2 may be alternately arranged. The first connection wiring SCW1 and the second connection wiring SCW2 may be electrically connected to the pad electrodes PAD through contact holes in areas overlapping the pad electrodes PAD.

Each of the connection wirings SCW may be connected to another gate conductive layer GL1 or GL2, the semiconductor layer PS and the data conductive layer SDL from the sealing member SEAL to a corresponding pad electrode PAD, thereby forming a circuit. The circuit may be, but is not limited to, an anti-static circuit or a power supply wiring circuit.

The second connection wiring SCW2 including the second conductive layer GL2 may include a multi-wiring structure. The second connection wiring SCW2 may include a parallel wiring STM and BRM in which a plurality of wirings are connected in parallel in plan view. The parallel wiring STM and BRM may include a stem wiring STM and one or more branch wirings BRM. The branch wirings BRM may branch and extend from the stem wiring STM and may join the stem wiring STM again to be connected to the stem wiring STM. A point at which the branch wirings BRM branch from the stem wiring STM or join the stem wiring STM may be defined as a connection point of the parallel wiring (hereinafter, shortened to a 'connection point'). For example, the second connection wiring SCW2 may have a parallel wiring (STM and BRM) structure in a section between two connection points. On the other hand, in a section outside the connection points, the second connection wiring SCW2 may have a single wiring structure in which only the stem wiring STM extends without the branch wirings BRM.

Of the two connection points of the parallel wiring STM and BRM, a first connection point (not shown) located relatively close to the display area DPA may overlap the sealing member SEAL or may be located inside the sealing member SEAL (that is, in the space inside the sealing member SEAL). Of the two connection points of the parallel wiring STM and BRM, a second connection point CNP located at a relatively outer side (end) may be located in the fourth insulating layer cover section VIR disposed outside the fourth insulating layer open section VOP in the space outside the sealing member SEAL. That is, the second connection point CNP may overlap the fourth insulating layer 140. Therefore, the second connection wiring SCW2 may maintain the parallel wiring (STM and BRM) structure in the fourth insulating layer open section VOP in the space outside the sealing member SEAL.

The fourth insulating layer open section VOP in the space outside the sealing member SEAL may be a section not covered by the fourth insulating layer 140 as described above, and the second connection wiring SCW2 may be covered by the third insulating layer 130 and thus protected from the external environment. As described herein, the fourth insulating layer open section VOP in the space outside the sealing member SEAL may be located near the sealing member SEAL and may be close not only to the cutting line of the encapsulation substrate ENG but also to a position to which the printed circuit board 50 may be attached. Therefore, the fourth insulating layer open section VOP may be subjected to thermal or mechanical shock imposed by a layer process for forming the sealing member SEAL, a process of cutting the encapsulation substrate ENG, and a process of attaching the printed circuit board 50. Accordingly, the third insulating layer 130 may crack. When the third insulating layer 130 cracks, a portion of the second connection wiring SCW2 in the fourth insulating layer open section VOP in the space outside the sealing member SEAL may be exposed to the external environment as shown in FIG. 9. External moisture or other damaging elements may permeate into the second connection wiring SCW2 through the cracks of the third insulating layer 130 and corrode or damage the corresponding area. When the second connection wiring SCW2 is increased in resistance or loses conductivity due to corrosion, it may not be able to smoothly perform signal transmission.

If the second connection wiring SCW in the fourth insulating layer open section VOP outside the sealing member SEAL may be configured as the parallel wiring STM and BRM, even when any one of the stem wiring STM and the branch wirings BRM may be damaged due to the cracks of the third insulating layer 130, signals may still be transmitted through the other wirings which are not corroded or otherwise remain intact. Therefore, the probability of signal transmission failure may be lowered.

In the fourth insulating layer cover section VIR in the space outside the sealing member SEAL, not only the third insulating layer 130 may be disposed, but also the fourth insulating layer 140 may be disposed on the third insulating layer 130 to overlap the third insulating layer 130. Therefore, the probability of cracking is low because of the third and fourth insulating layers. Therefore, the second connection wiring SCW2 may return to a single wiring in the fourth insulating layer cover section VIR in the space outside the sealing member SEAL. The second connection wiring SCW2 may be changed from the parallel wiring STM and BRM to a single wiring in a complicated circuit section such as an anti-static circuit or a power supply wiring circuit in order to pass the circuit section. The second connection point CNP at which the second connection wiring SCW2 may be changed from the parallel wiring STM and BRM to a single wiring may be disposed in the fourth insulating layer cover section VIR but may be disposed adjacent to a boundary between the fourth insulating layer open section VOP and the fourth insulating layer cover section VIR. The second connection point CNP may be located close to an end of the fourth insulating layer cover section VIR which may be relatively close to the display area DPA among the end of the fourth insulating layer cover section VIR which may be relatively close to the display area DPA and the other end which may be relatively close to the edge portion.

Figure 10:
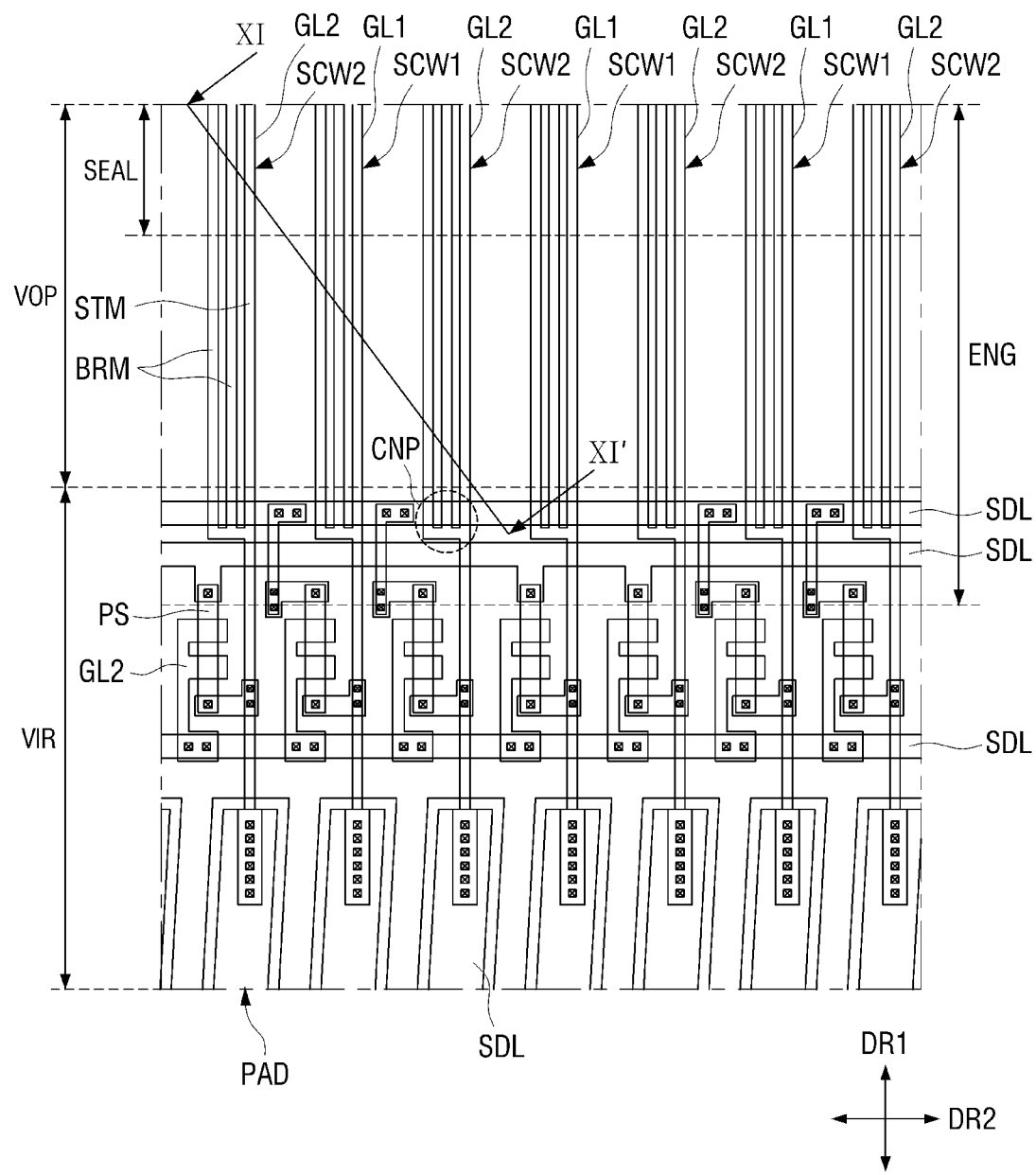
FIG. 10 is a partial plan layout view of a display panel according to an embodiment.

As described above with reference to FIG. 6, the fourth insulating layer open section VOP may also exist in the space inside the sealing member SEAL. Since the space inside the sealing member SEAL may be sealed by the sealing member SEAL, it may not be directly exposed to the external environment. Therefore, even when the third insulating layer 130 cracks and thus exposes the second connection wiring SCW2 in the fourth insulating layer open section VOP inside the sealing member SEAL, since the second connection wiring SCW2 is still exposed to the sealed environment, it may not be damaged as shown in FIG. 9 or FIG. 10. Therefore, the second connection wiring SCW2 may take the form of a single wiring in the fourth insulating layer open section VOP in the space inside the sealing member SEAL. That is, the first connection point (not shown) may be located in the fourth insulating layer open section VOP in the space inside the sealing member SEAL. However, embodiments are not limited, and the first connection point may also be located in a space covered by the fourth insulating layer 140 in the space inside the sealing member SEAL.

Hereinafter, other embodiments will be described.

Figure 11:
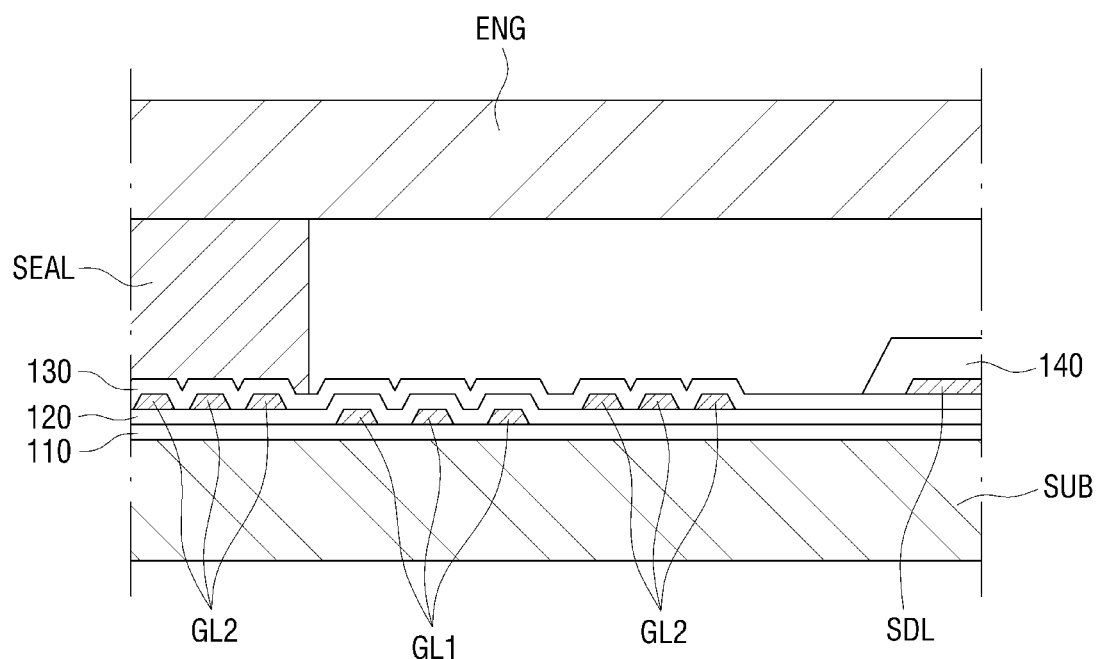
FIG. 11 is a cross-sectional view taken along line XI-XI' of FIG. 10.

FIG. 10 is a partial plan layout view of a display panel according to an embodiment. FIG. 11 is a cross-sectional view taken along line XI-XI' of FIG. 10.

Referring to FIGS. 10 and 11, the display panel according to the current embodiment is different from that of the embodiment of FIGS. 7 and 8 in that not only a second connection wiring SCW2 but also a first connection wiring SCW1 may include a parallel wiring STM and BRM which is a multi-wiring structure.

The first connection wiring SCW1 may be covered not only by a third insulating layer 130 but also by a second insulating layer 120 in a fourth insulating layer open section VOP in a space outside a sealing member SEAL. However, when both the third insulating layer 130 and the second insulating layer 120 crack, the first connection wiring SCW1 may be exposed to the external environment and damaged (e.g., corroded) as described above. Therefore, similar to the second connection wiring SCW2, the first connection wiring SCW1 may be formed as a parallel wiring STM and BRM including a stem wiring STM and branch wirings BRM in the fourth insulating layer open section VOP in the space outside the sealing member SEAL. Even if any one of the stem wiring STM and the branch wirings BRM may be damaged due to the cracking of the third insulating layer 130 and the second insulating layer 120, signals may still be transmitted through the other wirings. Therefore, the probability of signal transmission failure may be lowered. The connection points, arrangement, shape, and other considerations of the first connection wiring SCW1 may be substantially the same as those of the second connection wiring SCW2, and thus a redundant description thereof may be omitted.

Figure 12:
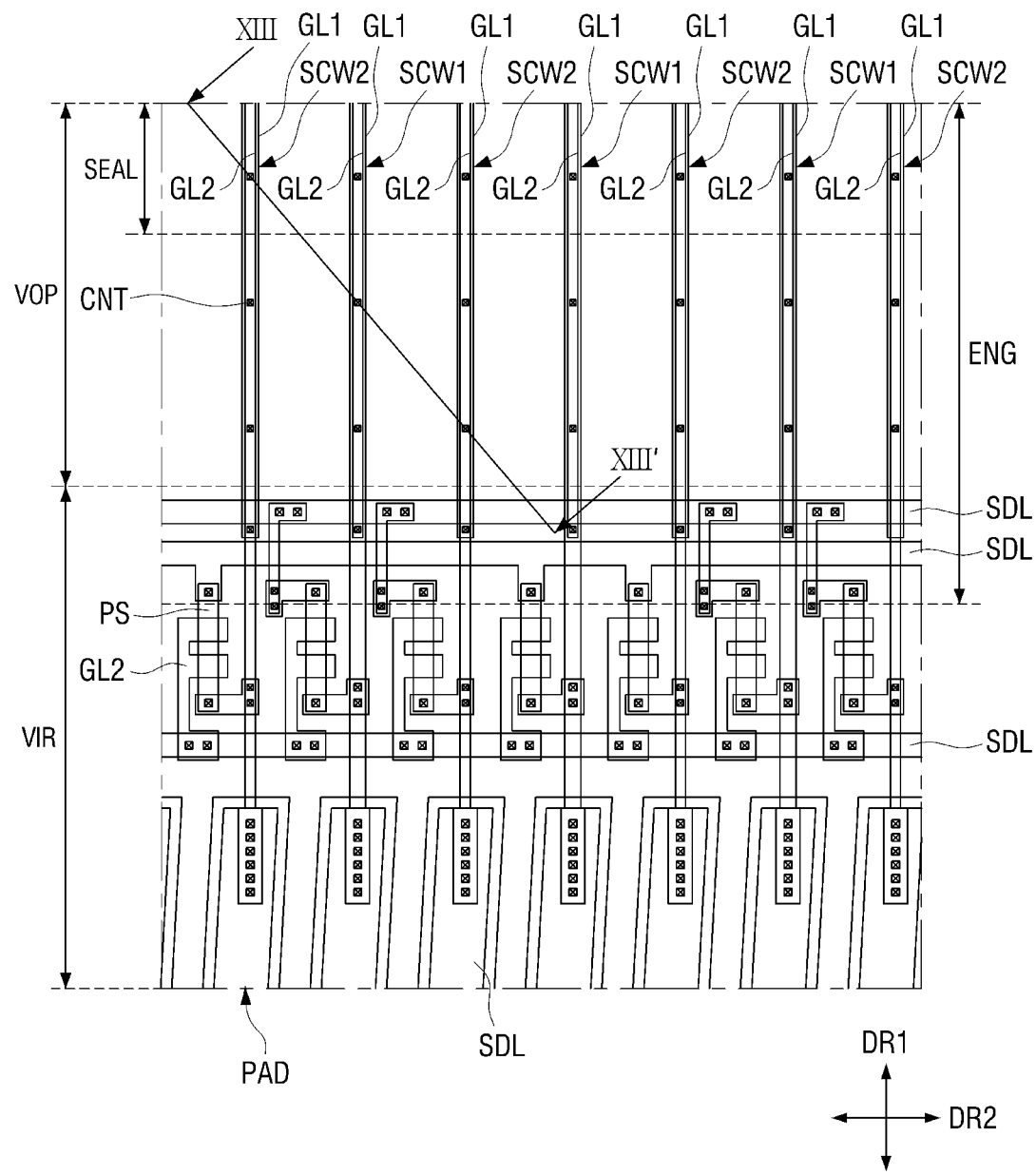
FIG. 12 is a partial plan layout view of a display panel according to an embodiment.
Figure 13:
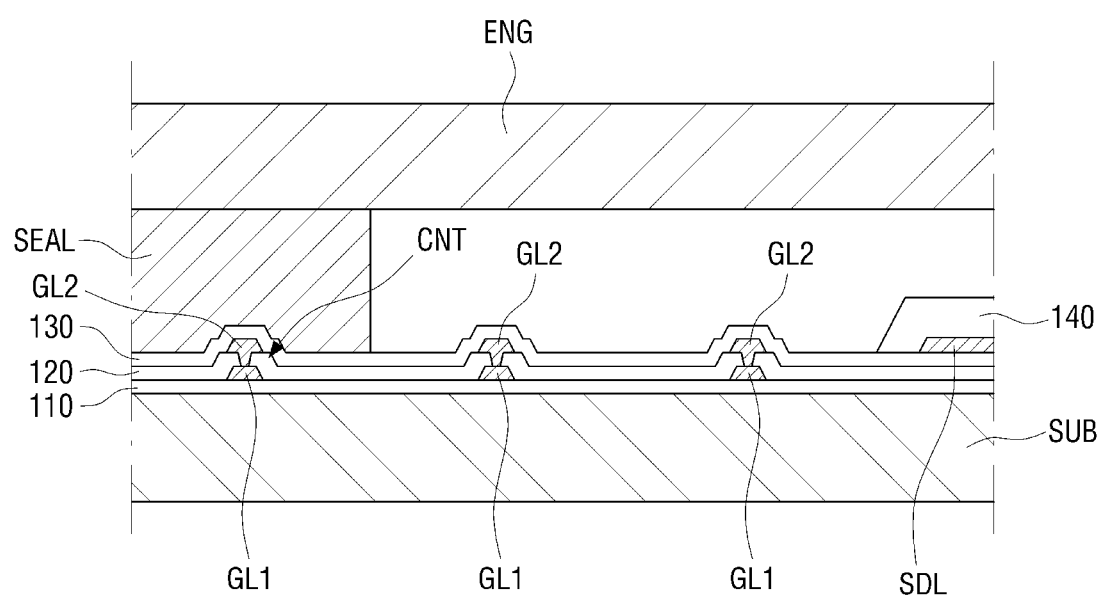
FIG. 13 is a cross-sectional view taken along line XIII-XIII' of FIG. 12.

FIG. 12 is a partial plan layout view of a display panel according to an embodiment. FIG. 13 is a cross-sectional view taken along line XIII-XIII' of FIG. 12.

Referring to FIGS. 12 and 13, the current embodiment shows that each of a first connection wiring SCW1 and a second connection wiring SCW2 may have a multi-wiring structure in the thickness direction.

The second connection wiring SCW2 may include not only a second gate conductive layer GL2 but also a fragment of a first gate conductive layer GL1. The first gate conductive layer GL1 of the second connection wiring SCW2 overlaps the second gate conductive layer GL2 in the thickness direction and may be electrically connected to the second gate conductive layer GL2 through one or more contact holes CNT. The first gate conductive layer GL1 of the second connection wiring SCW2 exists as a fragment extending in the first direction DR1. The first gate conductive layer GL1 may be formed at the same or similar position as the parallel wiring STM and BRM in the embodiment of FIG. 7 described above. The first gate conductive layer GL1 may be disposed in a fourth insulating layer open section VOP outside a sealing member SEAL and may end in a fourth insulating layer cover section VIR. The first connection wiring SCW1 may also include not only the first gate conductive layer GL1 but also a fragment of the second gate conductive layer GL2.

In the current embodiment, the first gate conductive layer GL1 and the second gate conductive layer GL2 may be connected in parallel in the thickness direction (vertical direction) in the fourth insulating layer open section VOP in a space outside the sealing member SEAL in which the second gate conductive layer GL2 and/or the first gate conductive layer GL1 may likely be exposed to the external environment when a third insulating layer 130 and/or a second insulating layer 120 cracks. Therefore, even if any one of the first gate conductive layer GL1 and the second gate conductive layer GL2 may be damaged, signal transmission may be still be performed by the other gate conductive layer.

Figure 14:
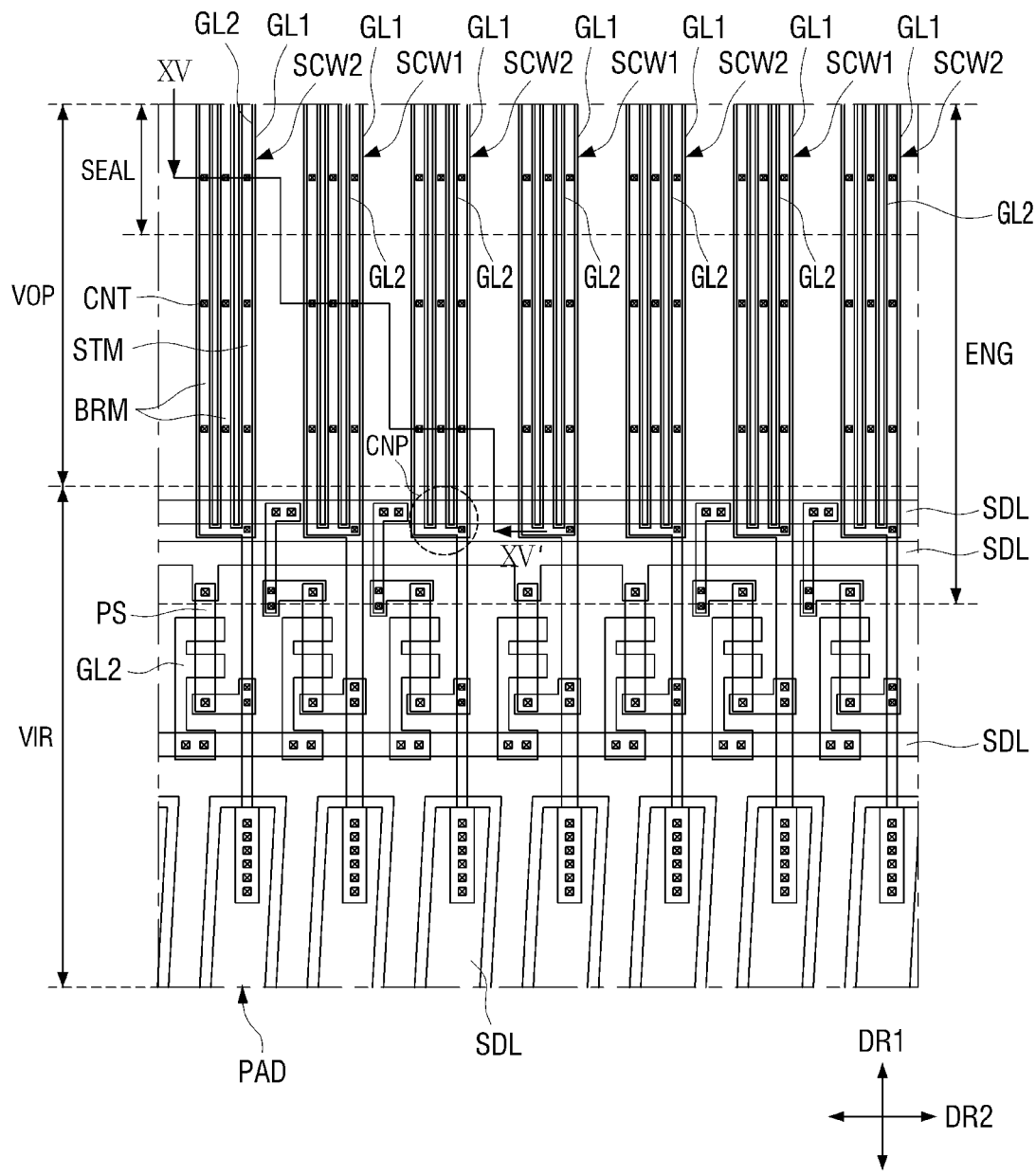
FIG. 14 is a partial plan layout view of a display panel according to an embodiment.
Figure 15:
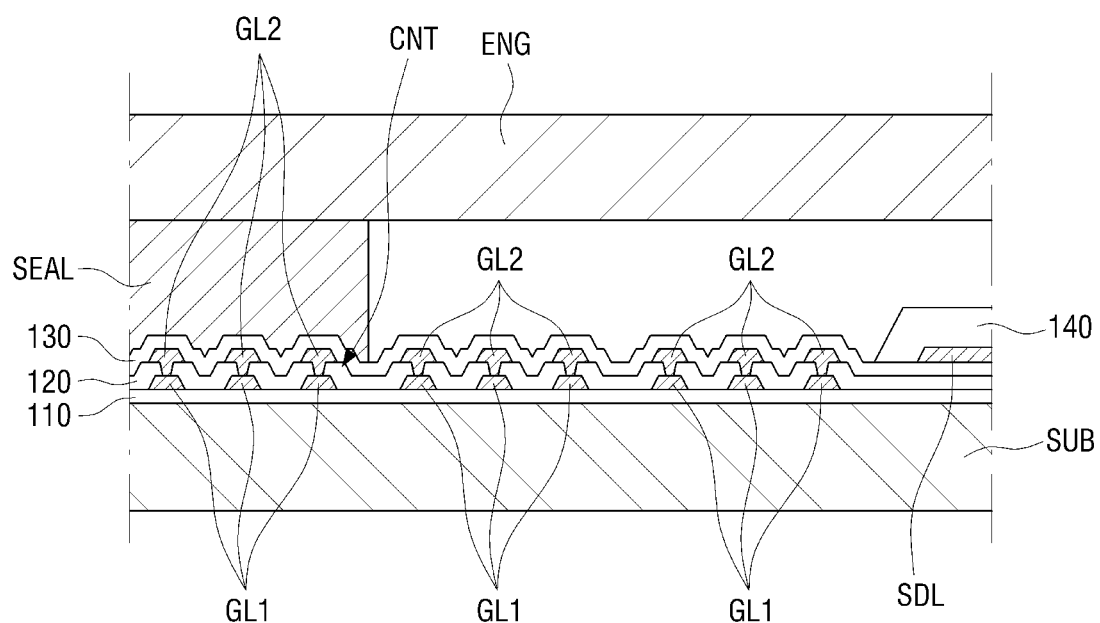
FIG. 15 is a cross-sectional view taken along line XV-XV' of FIG. 14.

FIG. 14 is a partial plan layout view of a display panel according to an embodiment. FIG. 15 is a cross-sectional view taken along line XV-XV' of FIG. 14.

Referring to FIGS. 14 and 15, the display panel according to the current embodiment shows that a first connection wiring SCW1 and a second connection wiring SCW2 may include not only a parallel wiring STM and BRM in which a plurality of wirings are connected in parallel in plan view, but also a multi-wiring structure in the thickness direction at corresponding positions. The embodiment of FIGS. 14 and 15 is a combination of the embodiment of FIGS. 10 and 11 and the embodiment of FIGS. 12 and 13. Since a plurality of wirings may be provided not only in plan view but also may be provided in the thickness direction in a fourth insulating layer open section VOP in a space outside a sealing member SEAL, even if some of the wirings may be damaged, signal transmission may still be performed by the other wirings. Therefore, the probability of signal transmission failure due to the cracking of a third insulating layer 130 and/or a second insulating layer 120 may be lowered.

In a display device according to an embodiment, a connection wiring may be formed as a multi-wiring structure. Therefore, even if a portion of the connection wiring may be damaged due to the cracking of an inorganic insulating layer in an organic insulating layer open section outside a sealing member, signals may still be transmitted through the other wirings which are not damaged. Therefore, the probability of signal transmission failure may be lowered.

While the invention has been illustrated and described with reference to the embodiments thereof, it will be apparent to those of ordinary skill in the art that various changes in form and detail may be formed thereto without departing from the spirit and scope of the invention.

What is claimed is:

1. A display device comprising:
a first substrate;
a second substrate facing the first substrate;
a sealing member between and surrounding the first substrate and the second substrate;
a pad electrode on the first substrate; and
a connection wiring on the first substrate and electrically connected to the pad electrode, wherein a first region inside the sealing member, a second region outside the sealing member and a third region overlapping the sealing member are defined,
the pad electrode is disposed in the second region,
the connection wiring comprises a multi-wiring structure comprising a plurality of wiring portions, the plurality of wiring portions being physically connected to each other at connecting portions in the second region and extending from the second region to the first region via the third region, and
the plurality of wiring portions are spaced apart from each other in the third region and any connecting portion physically connecting the plurality of wiring portions is not disposed in the third region overlapping the sealing member.

2. The display device of claim 1, wherein the multi-wiring structure comprises a parallel wiring in plan view.

3. The display device of claim 2, wherein the plurality of wiring portions are located on a same layer.

4. The display device of claim 3, wherein each of the plurality of wiring portions extends in a same direction.

5. The display device of claim 2, further comprising an inorganic insulating layer which is disposed on the first substrate and an organic insulating layer which is disposed on the inorganic insulating layer, wherein, in the second region, the inorganic insulating layer covers the parallel wiring, and the organic insulating layer at least partially exposes the parallel wiring.

6. The display device of claim 5, wherein an outer connection point at which the plurality of wiring portions being connected to each other overlaps the organic insulating layer.

7. The display device of claim 6, wherein the organic insulating layer is spaced apart from the sealing member.

8. The display device of claim 5, wherein the plurality of wiring portions are further connected at an inner connection point in the first region.

9. The display device of claim 8, wherein the organic insulating layer disposed in the first region is spaced apart from the sealing member, and the inner connection point is located in an area in which the organic insulating layer and the sealing member are spaced apart from each other.

10. The display device of claim 1, further comprising:
a first conductive layer disposed on the first substrate;
an inorganic insulating layer disposed on the first conductive layer; and
a second conductive layer disposed on the inorganic insulating layer.

11. The display device of claim 10, wherein the multi-wiring structure comprises the first conductive layer and the second conductive layer which overlaps the first conductive layer and is electrically connected to the first conductive layer through at least one contact hole.

12. A display device comprising:
a base substrate;
a first gate conductive layer disposed on the base substrate;
a first insulating layer disposed on the first gate conductive layer;
a second gate conductive layer disposed on the first insulating layer;
a third insulating layer disposed on the second gate conductive layer;
a data conductive layer disposed on the third insulating layer;
a fourth insulating layer disposed on the data conductive layer;

an anode disposed on the fourth insulating layer;
a light emitting layer disposed on the anode;
a cathode disposed on the light emitting layer;
an encapsulation substrate disposed over the cathode; and
a sealing member interposed between the base substrate and the encapsulation substrate,
wherein the base substrate comprises a pad area protruding outward from the sealing member, and the pad area comprises:
  a fourth insulating layer open section in which the fourth insulating layer is not disposed and a fourth insulating layer cover section in which the fourth insulating layer is disposed, wherein the fourth insulating layer open section and the fourth insulating layer cover section are sequentially arranged in a direction outward from the sealing member; and
  a pad electrode and a connection wiring electrically connected to the pad electrode, wherein the connection wiring comprises the first gate conductive layer or the second gate conductive layer disposed in the pad area, and the connection wiring comprises a parallel wiring including a stem wiring disposed in the fourth insulating layer open section and one or more branch wirings electrically connected to the stem wiring.

13. The display device of claim 12, wherein the stem wiring and the branch wirings are electrically connected in the fourth insulating layer cover section.

14. The display device of claim 13, wherein the stem wiring and the branch wirings are located on a same layer.

15. The display device of claim 14, wherein the branch wirings extend in a same direction as the stem wiring.

16. The display device of claim 12, wherein the pad electrode comprises the data conductive layer.

17. The display device of claim 16, wherein the pad electrode is electrically connected to the connection wiring through a contact hole in the fourth insulating layer cover section.

18. The display device of claim 12, wherein the connection wiring comprises the second gate conductive layer, and the third insulating layer comprises a crack in the fourth insulating layer open section.

19. The display device of claim 18, wherein the crack of the third insulating layer exposes a portion of the parallel wiring to an external environment.

20. The display device of claim 19, wherein some of the stem wiring and the branch wirings of the parallel wiring are corroded, and the other wirings are not corroded.

* * * * *